United States Patent [19]

Khajezadeh

[11] 4,170,501

[45] Oct. 9, 1979

[54] METHOD OF MAKING A SEMICONDUCTOR INTEGRATED CIRCUIT DEVICE UTILIZING SIMULTANEOUS OUTDIFFUSION AND AUTODOPING DURING EPITAXIAL DEPOSITION

[75] Inventor: Heshmat Khajezadeh, Somerville, N.J.

[73] Assignee: RCA Corporation, New York, N.Y.

[21] Appl. No.: 877,856

[22] Filed: Feb. 15, 1978

[51] Int. Cl.[2] .................... H01L 21/20; H01L 21/74
[52] U.S. Cl. .................... 148/175; 29/576 E; 29/577 R; 29/578; 148/190; 148/191; 357/48; 357/63; 357/89; 357/90; 357/92
[58] Field of Search .................... 148/175, 190, 191; 357/48, 63, 89, 90, 92; 29/576 E, 577, 578

[56] References Cited

U.S. PATENT DOCUMENTS

| | | | |
|---|---|---|---|
| 3,244,950 | 4/1966 | Ferguson | 148/175 X |
| 3,271,208 | 9/1966 | Allegretti | 148/175 |
| 3,479,233 | 11/1969 | Lloyd | 148/191 X |
| 3,582,725 | 6/1971 | Matukura et al. | 357/48 X |
| 3,591,430 | 7/1971 | Schlegel | 148/175 |
| 3,759,760 | 9/1973 | Encinas | 148/175 |
| 3,802,968 | 4/1974 | Ghosh et al. | 148/175 |
| 3,846,192 | 11/1974 | Murrmann | 148/175 |
| 3,885,998 | 5/1975 | Reindl | 148/190 X |
| 3,961,340 | 6/1976 | Encinas | 357/48 X |
| 4,032,372 | 6/1977 | Vora | 148/191 X |

OTHER PUBLICATIONS

Nuttall, R., "Dependence on Deposition. . . Epitaxial Silicon Layers", J. Electrochem. Soc., vol. 111, No. 3, Mar. 1964, pp. 317-323.
Regh et al., "Preparation of Substrate. . .Integrated Circuits", I.B.M. Tech. Discl. Bull., vol. 13, No. 4, 1970, p. 924.
Chin et al., "Integrated Circuit. . . Silicon Devices", I.B.M. Tech. Discl. Bull., vol. 16, No. 6, Nov. 1973, pp. 1985-1986.
Wolf, *Semiconductors* (Textbook), Wiley, New York, N. Y., 1971, p. 31.

*Primary Examiner*—L. Dewayne Rutledge
*Assistant Examiner*—W. G. Saba
*Attorney, Agent, or Firm*—H. Christoffersen; D. S. Cohen; T. H. Magee

[57] ABSTRACT

A semiconductor integrated circuit device includes circuit elements having relatively different performance characteristics in which buried regions having different chemical elements are used to autodope an epitaxial layer to different degrees.

4 Claims, 4 Drawing Figures

METHOD OF MAKING A SEMICONDUCTOR INTEGRATED CIRCUIT DEVICE UTILIZING SIMULTANEOUS OUTDIFFUSION AND AUTODOPING DURING EPITAXIAL DEPOSITION

This invention relates to a semiconductor integrated circuit device which includes circuit elements having relatively different performance characteristics and to a method of manufacturing these devices.

Bipolar digital and linear integrated circuit devices are often formed in a layer of semiconductor material which is usually an epitaxial layer on a substrate which contains buried regions of the same type conductivity as the layer but with a relatively low resistivity. When low voltage, high speed circuit elements, such as those required for digital circuits using integrated injection logic ($I^2L$), are to be formed, it is desirable for the epitaxial layer to be relatively thin and to be relatively highly doped, i.e. to have relatively low resistivity. On the other hand, when high voltage circuit elements are to be formed, it is desirable to have a relatively thick, relatively high resistivity layer. When it is desired to combine relatively low voltage and relatively high voltage circuit elements on the same chip, compromises are required in the thickness and the resistivity of the epitaxial layer.

Manufacturers who use established technology for the manufacture of bipolar integrated circuits (usually requiring high voltage circuit elements) have encountered a problem when attempting to integrate low voltage $I^2L$ circuit elements into their devices. If no modifications of the processing are made, the resulting $I^2L$ elements have a poor ratio of inverse beta to forward beta because of poor emitter efficiency. To improve the inverse beta of these devices attempts have been made to increase the forward beta but this has resulted in poor yields.

Figure 1:
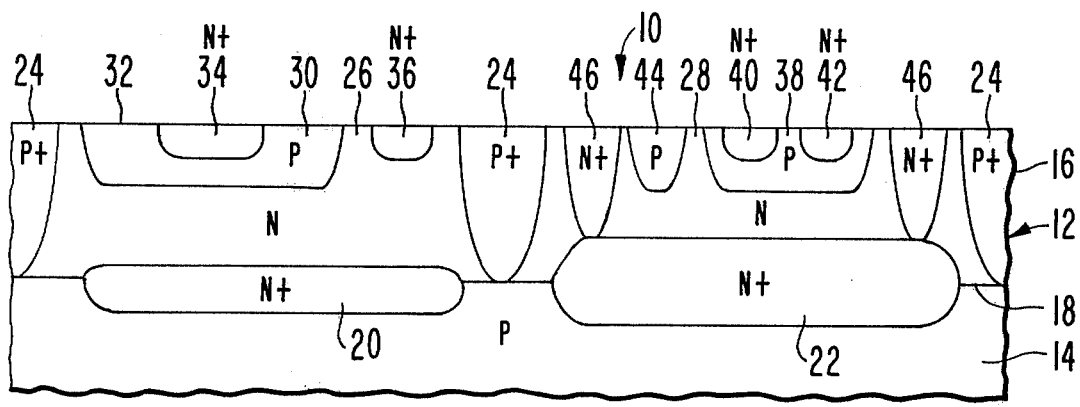
FIG. 1 is a partial diagrammatic cross section of an example of an integrated circuit device illustrating the principles of the present invention.

An example of an integrated circuit device 10 illustrating the principles of the present invention is partially and diagrammatically illustrated in FIG. 1. The integrated circuit device 10 includes a body 12 of semiconductive material, usually silicon, including a substrate 14 of one type conductivity and an epitaxial layer 16 of opposite type conductivity with an interface 18 therebetween. In usual practice, and in this example, the substrate 14 is of P type conductivity and the epitaxial layer 16, as formed, is of N type conductivity.

Adjacent to the interface 18 and in the substrate 14 is a first localized region or buried pocket 20 which contains opposite type conductivity modifiers to a relatively high degree. As shown in FIG. 1, the buried pocket 20 extends somewhat beyond the interface 18 into the epitaxial layer 12. While this is diagrammatic, it generally represents the condition in finished devices which results from out-diffusion and/or autodoping of modifiers from the substrate into the epitaxial layer during its growth.

A second localized region or buried pocket 22 of opposite type conductivity is in the substrate 14 adjacent to the interface 18 and is spaced from the first region 20. The second buried pocket 22 also extends into the epitaxial layer 16 as suggested in FIG. 1. In this case, however, the second buried pocket 22 extends further into the epitaxial layer 16 than does the buried pocket 20. Actually, the drawing does not and cannot represent the actual physical structure inasmuch as there is no distinct boundary between either of the buried pockets 20 or 22 and the epitaxial layer 16. However, there are more modifiers in the epitaxial layer 16 which result from out-diffusion and/or autodoping from the second buried pocket 22 than from the first buried pocket 20.

In order to accomplish the result just outlined, the two buried pockets 20 and 22 are formed by doping the substrate 14 with different conductivity modifiers. In particular, different elements are used which may be, for example, antimony for the first buried pocket 20 and arsenic for the second buried pocket 22. These two elements are characterized by substantially equal diffusion coefficients in silicon, but they have substantially different vapor pressures at the temperature of growth of the epitaxial layer. The second chemical element, arsenic, has a relatively high vapor pressure at that temperature. Consequently, during the formation of the epitaxial layer 16, a portion of that layer which is adjacent to the second buried pocket 22 will contain an autodoped number of atoms of arsenic which is greater than the autodoped number of atoms of antimony in that portion of the epitaxial layer 16 which is adjacent to the first buried pocket 20. There are other combinations of different chemical elements which might be used in an attempt to provide epitaxial layer portions of different doping concentrations in this manner, for example, antimony with phosphorus or arsenic with phosphorus. Phosphorus, however, has a relatively high diffusion coefficient in silicon and it is difficult to control the amount of phosphorus which enters the epitaxial layer 16. By avoiding the use of phosphorus and relying on autodoping instead of out-diffusion more accurate control can be achieved.

As will appear in the description of the present novel method below, one additional difference between the buried pocket 20 and the buried pocket 22 is that a higher surface concentration of arsenic is employed for the buried pocket 22 than of antimony for the buried pocket 20. This supplements the autodoping effect described above.

The additional elements shown in FIG. 1 are as follows. First, there are generally conventional P+ type isolation regions 24 which divide the epitaxial layer 16 into separate islands, 26 and 28 in this example. Means are provided in that portion of the epitaxial layer 16 which is adjacent to the first buried pocket 20, i.e., the island 26, to define a circuit element having relatively high voltage characteristics, in particular a bipolar transistor. For this purpose, there is a P type region 30 adjacent to a surface 32 of the epitaxial layer 16 and an N+ type region 34 within the P type region 30. These regions 30 and 34 serve as base and emitter regions respectively with the material of the island 26 serving as the collector region of the transistor. A collector contact region 36 may be provided, if desired, adjacent to the surface 32 and spaced from the P type region 30.

In the island 28, means are provided to define a circuit element having a relatively low voltage characteristic, in this example, a two-collector $I^2L$ structure. For this purpose, there is adjacent the surface of the epitaxial layer 16 a second P type region 38 within the island 28, and a pair of N+ type regions 40 and 42 within the P type region 38, and a third P type region 44 in the island 28 spaced from the second P type region 38. Functionally, these regions define a lateral injector transistor with the region 44 as its emitter, a portion of the island 28 at its base, and the second P type region 38 at its collector. The switching transistors of the I²L structure are defined by the material of the island 28 as the common emitter, the second P type region 38 as the common base, and the regions 40 and 42 as the collectors thereof. An emitter contact region 46 may be provided extending from the surface 32 of the epitaxial layer 16 down to the buried pocket 22. In general this I²L structure is conventional, but differs from known structures in that it has better emitter efficiency owing to the fact that the island 28 is more highly doped than the island 26, by the use of arsenic as the buried pocket doping material and the autodoping effect described above.

Figure 2:
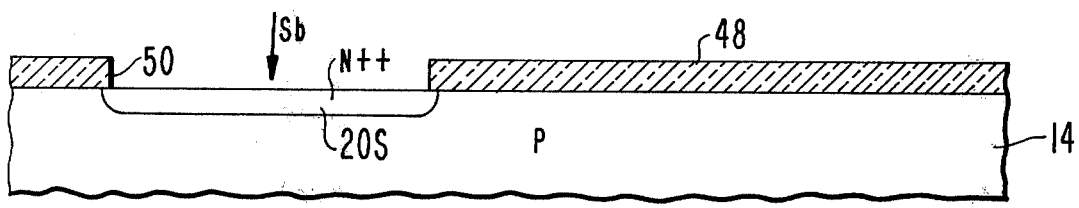
FIGS. 2–4 are a series of partial cross-sectional views illustrating steps in the present method.
Figure 3:
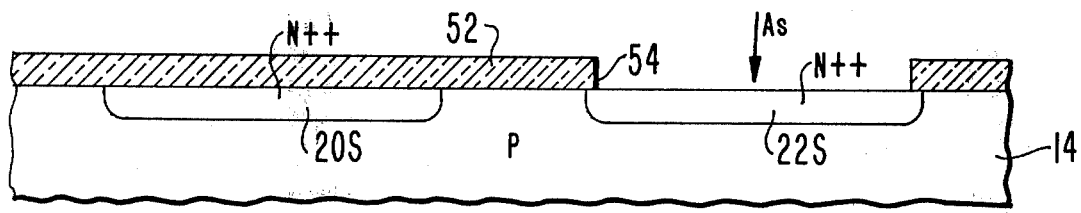
Figure 4:
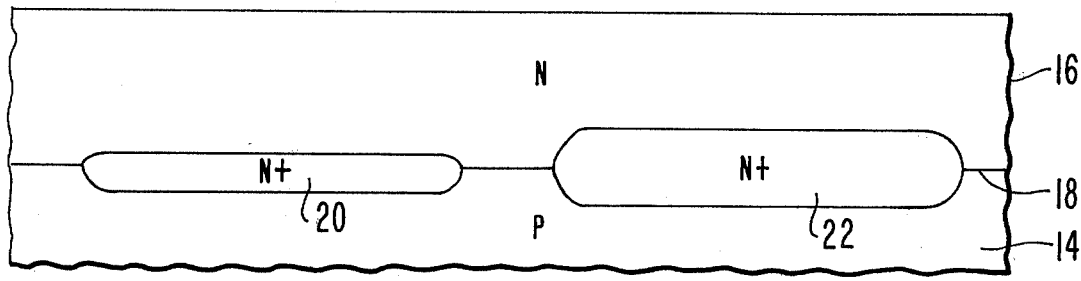

Some of the steps of the present novel method are illustrated in FIGS. 2–4. Conventional steps of etching and cleaning, for example, are omitted in the following description for purpose of clarity.

The process begins with a conventional substrate 14 provided with a surface masking coating 48 of silicon dioxide, for example. By means of conventional photolithographic procedures, an opening 50 is provided in the masking coating 48 to define the location of the first buried pocket 20. The substrate 14 is then placed in a standard diffusion furnace and antimony is diffused through the opening 50 to provide in the substrate 14 a diffusion region 20S of relatively high N type conductivity, labelled N++ in FIG. 2. The diffusion conditions should be chosen so as to provide the region 20S with a sheet resistivity of from 25–30 ohms/sq.

With reference to FIG. 3, the masking coating 48 is removed and a new masking coating 52 is applied to the surface of the substrate 14. A photolithographically defined opening 54 is made in the coating 52 at the location for the second buried pocket 22, after which arsenic is diffused into the substrate 14 to establish a region 22S. The diffusion conditions for this step should be chosen so as to provide a relatively higher degree of doping in the region 22S as compared to the region 20S. A sheet resistivity of around 10 ohms/square is relatively easy to obtain since arsenic has a good lattice match to the silicon of the substrate 14.

The next steps are to prepare the substrate 14 in conventional manner for the growth of the epitaxial layer 16 and to grow that layer. The result is illustrated in FIG. 4 with the diagrammatic showing of the different extents of the regions 20 and 22. Because advantage is here taken of the autodoping phenomenon, precautions must be taken in the growth of the epitaxial layer 16. An important precaution is to employ a reactor for the epitaxial deposition in which relatively little lateral flow of gases takes place over the surface of the substrate 14. A known form of horizontal reactor known as a pancake reactor serves this purpose well. Next, the growth time and temperature should be controlled so as to provide the epitaxial layer 16 with a thickness of about 6–8 μm. This is relatively thin compared to standard practice in the art but allows the layer to be grown relatively quickly and provides a thickness which is particularly advantageous to the I²L section of the device. Of course, during its growth the epitaxial layer 16 may be doped from an external source and the desired result is to provide the layer with a resistivity of about 0.5 to about 0.8 ohm-cm. The actual resistivity of any localized region of the epitaxial layer will depend on the combination of the external dopant and that resulting from the autodoping phenomenon so that the actual resistivity of the epitaxial layer is different at different locations in the layer. The resistivity of any localized portion of the epitaxial layer is the sum of that resulting from the exterior source modifiers and that from the autodoped modifiers.

By carrying out the process in this manner, it is possible to fabricate both high voltage and low voltage devices on the same chip, particularly where the low voltage device is an I²L device. The high concentration arsenic buried pocket will autodope the epitaxial region of the I²L device, resulting in better emitter efficiency and higher inverse beta at relatively low breakdown. The low breakdown is not a problem for the I²L section since this portion of a circuit is usually designed to operate on less than 1 volt of supply voltage. The relatively high voltage device, such as the transistor described above, can operate at conventional voltage levels.

What is claimed is:

1. A method of making a semiconductor device comprising
    forming adjacent to a first portion of a surface of a substrate of semiconductive material of one type conductivity a first localized region containing opposite type conductivity modifiers consisting essentially of a first chemical element having a predetermined diffusion coefficient in said semiconductor material and a predetermined vapor pressure at a given temperature,
    forming adjacent to a second portion of said substrate surface a second localized region containing opposite type conductivity modifiers consisting essentially of a second different chemical element having a diffusion coefficient substantially the same as said first chemical element but a substantially higher vapor pressure at said given temperature,
    growing an epitaxial layer of said semiconductor material on said surface of said substrate at said given temperature whereby that portion of said epitaxial layer which is adjacent to said second region contains an autodoped number of atoms of said second chemical element which is greater than the autodoped number of atoms of said first chemical element in that portion of said epitaxial layer which is adjacent to said first localized region, introducing conductivity modifiers into that portion of said epitaxial layer which is adjacent to said first localized region to define a circuit element having predetermined characteristics, and introducing conductivity modifiers into that portion of said epitaxial layer which is adjacent to the second localized region to define a circuit element having characteristics different from those of the first mentioned circuit element.

2. A method of making a semiconductor device as defined in claim 1 wherein said semiconductor material is silicon, said one type is P type, said opposite type is N type, and wherein said first localized region is formed by diffusing antimony into said substrate to a predetermined surface concentration and said second localized region is formed by diffusing arsenic into said substrate to a predetermined surface concentration.

3. A method of making a semiconductor device as defined in claim 2 wherein arsenic is diffused to a surface concentration greater than that of the antimony diffusion.

4. A method of making a semiconductor device as defined in claim 3 wherein during its growth said epitaxial layer is also doped from an exterior source of opposite type modifiers whereby the number of opposite type modifiers in a given portion of said epitaxial layer is the sum of the exterior source modifiers and the autodoped modifiers.

* * * * *